United States Patent

Ramm et al.

[11] Patent Number: 5,563,084
[45] Date of Patent: Oct. 8, 1996

[54] METHOD OF MAKING A THREE-DIMENSIONAL INTEGRATED CIRCUIT

[75] Inventors: Peter Ramm, Pfaffenhofen; Reinhold Buchner, Unterföhring, both of Germany

[73] Assignee: Fraunhofer-Gesellschaft zur Förderung der angewandten Forschung e.V., Munich, Germany

[21] Appl. No.: 532,858

[22] Filed: Sep. 22, 1995

[30] Foreign Application Priority Data

Sep. 22, 1994 [DE] Germany ............ 44 33 845.7

[51] Int. Cl.⁶ ..................... H01L 21/70
[52] U.S. Cl. ............. 437/51; 437/8; 437/208; 437/226; 437/974; 148/DIG. 135
[58] Field of Search .............. 437/51, 52, 59, 437/8, 56, 208, 226, 974; 148/DIG. 135

[56] References Cited

U.S. PATENT DOCUMENTS

| | | | |
|---|---|---|---|
| 4,924,589 | 5/1990 | Leedy ................................ | 437/8 |
| 4,939,568 | 7/1990 | Kato et al. .......................... | 357/75 |
| 4,954,875 | 9/1990 | Clements ............................ | 357/75 |
| 5,087,585 | 2/1992 | Hayashi .............................. | 437/51 |
| 5,104,820 | 4/1992 | Go et al. ............................ | 437/51 |
| 5,208,178 | 5/1993 | Usami ................................ | 437/8 |
| 5,244,818 | 9/1993 | Jokerst et al. ..................... | 437/974 |
| 5,258,318 | 11/1993 | Buti et al. ........................ | 437/51 |
| 5,270,261 | 12/1993 | Bertin et al. ..................... | 148/DIG. 135 |
| 5,324,678 | 6/1994 | Kusunoki ............................ | 437/51 |
| 5,324,687 | 6/1994 | Wojnarowski ........................ | 437/974 |
| 5,391,257 | 2/1995 | Sullivan et al. ................... | 437/974 |
| 5,476,810 | 12/1995 | Curran ............................. | 148/DIG. 135 |
| 5,489,554 | 2/1996 | Gates .............................. | 437/208 |

OTHER PUBLICATIONS

Tewksbury et al., IEEE Circuits and Devices Magazine (Sep.1989).
Akasaka et al., Solid State Technology (Feb. 1989).
Akasaka, Y., Proc. IEEE 74 (1986) p. 1703.
Hayashi, Y. et al., Proc. 8th Int. Workshop on Future Electron Devices (1990), p. 85.

*Primary Examiner*—Kevin M. Picardat
*Attorney, Agent, or Firm*—Karl Hormann

[57] ABSTRACT

A method of making a three dimensionally integrated circuit by connecting first and second substrates (1;7) provided with devices in at least one layer in at least one surface in each of said substrates. An auxiliary substrate is connected to the one surface of one of said substrates which is then reduced in thickness from its opposite surface. The auxiliary layer with the devices thereon is then separated into individual chips which after having been found to be functioning are aligned and mounted in a side-by-side arrangement on said one surface of said first substrate. Electrical connection are formed between the devices of the mounted chips and the devices in the first substrate.

17 Claims, 2 Drawing Sheets

METHOD OF MAKING A THREE-DIMENSIONAL INTEGRATED CIRCUIT

CROSS-REFERENCE TO RELATED APPLICATION

The subject matter of the present application relates generally to that of copending applications No. 08/532,368= DE P 44 33 833.3 (Attorney Docket 950123) and 08/532, 367=DE P 44 33 846.5 (Attorney Docket 950125) both filed contemporaneously herewith.

BACKGROUND OF THE INVENTION

1. Field of the Invention

The invention, in general, relates to a novel method of making a three-dimensional integrated circuit and, more particularly, to a method providing high systemic yields in the fabrication of a three-dimensional integrated circuit with conventional, i.e. standard industrial, equipment.

As used herein, the term three-dimensional integration is intended to connote the vertical interconnection of devices fabricated by planar technology. The advantages of a three-dimensionally integrated microelectronic system are, among others, that with substantially identical design rules, higher package densities and switching rates may be obtained as compared to two-dimensional systems. These result from shorter wiring paths or interconnections between individual devices or circuits and the possibility of parallel data processing. The increased efficiency of the system is optimized by utilizing interconnection technology offering vertical interconnections which are freely selectable as to their positioning and which are suitable for super large-scale integration (VLSI).

2. The Prior Art

The following methods of fabricating three-dimensional circuit arrangements with freely selectable vertical contacts are known:

Y. Akasaka, Proc. IEEE 74 (1986), p. 1703, suggests depositing and recrystallizing polycrystalline silicon on a fully processed device layer so that further devices may be formed in the recrystallized layer. The disadvantages of such a method reside in the yield-reducing degradation of the devices in the lower level because of the high thermic stress induced by the recrystallization process and because of the necessarily serial processing of the overall system. They lead to correspondingly long cycle times during fabrication, as well as to reduced yields because of accumulating of process-inherent failures or rejects. Both increase manufacturing costs significantly as compared to separately processing individual layers in separate substrates.

Y. Hayashi et al., Proc. 8th Int. Workshop on Future Electron Devices, 1990, page 85, proposes initial fabrication of separate devices in separate substrates. Thereafter the substrates are reduced in their thickness to a few micrometers, provided with front and back leads and connected to each other by a bonding process. Special processes such as MOS-incompatible materials, for instance, gold, and patterning or structuring the back surface of the substrate, not provided for in the standard fabrication techniques of semiconductors such as, for instance, complementary metal oxide semiconductors (CMOS) are, however, required to provide the front and back leads.

U.S. Pat. No. 4,939,568 describes a method of fabricating a three-dimensional integrated circuit structure by stacking individual ICs on a substrate to form a chip stack. To this end, a substrate provided with fully processed ICs is first divided into unit chips, whereby processing at the wafer level is completed. The chips are tested (wafer sorted), and a first unit chip is mounted on a substrate by thermocompression. Following this step, another chip is mounted (piggy-backed) in the same manner to the first chip. Hence, a first chip stack will be finished before fabrication of a further chip stack on another substrate can be begun. Further processing of the chip stack is, therefore, not possible at the wafer level.

A serious disadvantage of the aforementioned methods derives from the fact that equipment available in silicon technology lends itself only to processing of the disc-shaped or sliced substrates, known as wafers. Processing of substrates differing therefrom, especially of individual chips, can be performed with experimental test equipment only; but it is not possible on the scale of industrial fabrication scale with required high yields.

U.S. Pat. No. 4,954,875 describes a method of three-dimensional integration by stacking individual wafers, in which the interconnection between individual device planes is provided by specially formed vias. By combining substrates containing a plurality of identical devices, viz.: chips, the resulting yield of a multi-layer system is derived from the product of the individual yields. This leads to a drastically reduced yield in a system embracing several device planes, such as a system made in accordance with the method of U.S. Pat. No. 4,954,875. Thus, at a yield of 80% of an individual plane, the resulting total yield of a system combined of ten layers is but 10%, making such a system uneconomical. Such technology is, therefore, restricted to a few specialized applications. The yield of a device substrate is also dependant upon its circuit species and its fabrication process. Very high yields are obtained, for example, in the field of memory components, whereas markedly lower yields are obtained in logic devices, such as microprocessors. Particularly where different species of such circuits are stacked together, the total yield is disproportionately determined by that species of circuit providing the lowest yield.

OBJECTS OF THE INVENTION

It is an object of the invention to provide a novel method of making a three-dimensional integrated circuit, which, using conventional industrial standard equipment, at the wafer level provides markedly higher yields, relative to hitherto known methods.

Other objects will in part be obvious and will in part appear hereinafter.

BRIEF SUMMARY OF THE INVENTION

In a preferred embodiment of the invention these and other objects are accomplished by a method of making a three-dimensional integrated circuit which includes the steps of: providing a first substrate which at a first surface is provided with at least one fully processed device plane containing a plurality of independent devices or circuits in a side-by-side arrangement, wherein the devices or circuits of a plurality of device planes form a device stack; providing a second substrate which at one surface is provided with at least one fully processed device plane containing a plurality of independent devices or circuits in a side-by-side arrangement, wherein the devices and circuits of a plurality of device planes form a device stack, the devices, device stacks or circuits having been tested to distinguish between functioning and defective devices, device stacks or circuits; connecting the one surface of the second substrate to an auxiliary substrate; thinning or reducing the second substrate from a surface opposite the one surface; separating the auxiliary substrate and the devices connected thereto into individual chips respectively containing functioning or defective devices, device stacks or circuits; aligning and attaching chips containing functioning devices, device stacks or circuits in side-by-side relationship on the first side of the first substrate; removing the auxiliary substrate; planarizing moats created between individual chips as a result of their aligning and attaching; and simultaneously with, or subsequently to, the attaching of the chips providing electrical contacts between the devices, device stacks or circuits of the attached chips and the devices, device stacks and circuits of the first substrate.

BRIEF DESCRIPTION OF THE SEVERAL DRAWINGS

The novel features which are considered to be characteristic of the invention are set forth with particularity in the appended claims. The invention itself, however, in respect of its structure, construction and lay-out as well as manufacturing techniques, together with other objects and advantages thereof, will best be understood from the following description of preferred embodiments when read in connection with the appended drawings, in which:

DETAILED DESCRIPTION OF PREFERRED EMBODIMENTS

Figure 1:
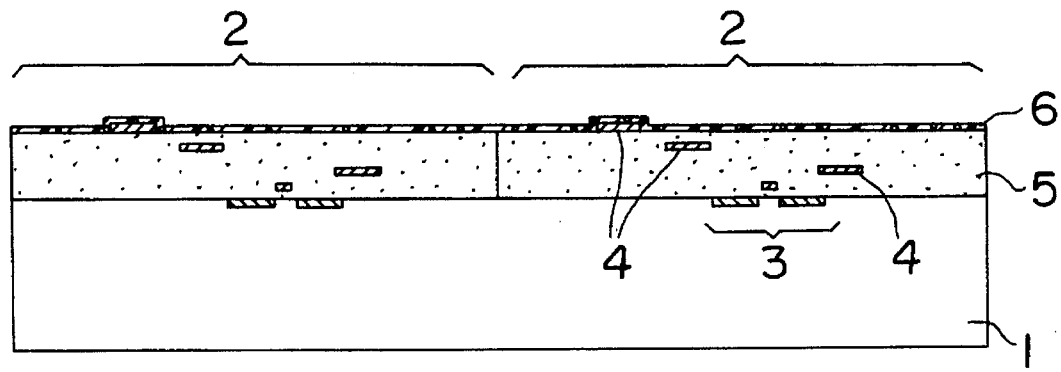
FIG. 1 depicts a first device substrate including circuit structures and metallization planes (lower substrate)

With reference to FIG. 1, a first device substrate or wafer 1 made, for instance, of monocrystalline silicon, includes a plurality of usually identical chips 2 arranged in a defined pattern or design and which include such circuit structures 3 as, for instance, a metal oxide semiconductor (MOS) transistor and one or more metallization planes 4. Usually, the metallization planes 4 consist of aluminum, aluminum alloy or other materials, such as copper or tungsten, and are surrounded, for purposes of electrical insulation, by an oxide layer 5. For purposes of planarization, the oxide layer 5 may be doped with boron and/or phosphorus. The uppermost metallization plane 4 may also be covered by a passivation layer 6 of silicon oxide or silicon nitride, for instance. Furthermore, alignment structures (not shown in FIG. 1) are provided for the joining of several wafers in precisely defined relationship. Below the circuit structures 3, the thickness of the substrate measures 625 µm, for instance. This device substrate is the bottom substrate of a multi-layer system (FIG. 1).

Figure 2:
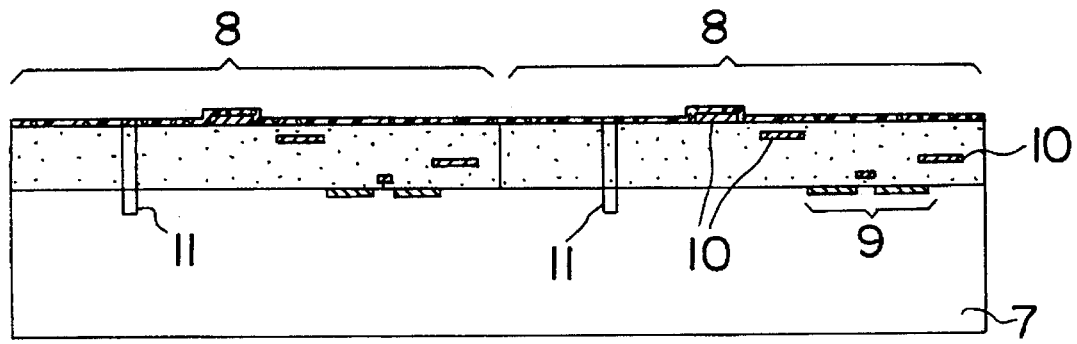
FIG. 2 depicts a second device substrate including circuit structures, metallization planes and via holes (upper substrate)
Figure 3:
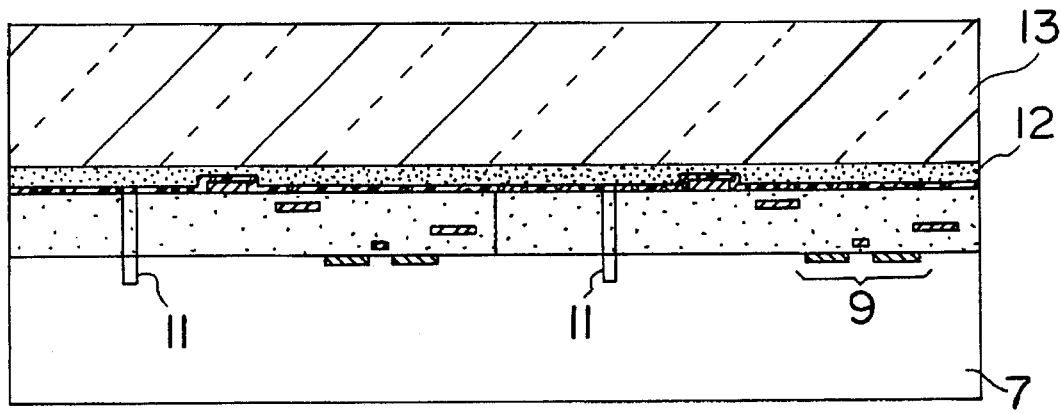
FIG. 3 depicts the device substrate of FIG. 2 with an adhesion layer and an auxiliary substrate.

A second device substrate 7 also contains a plurality of usually identical chips 8 arranged in a defined pattern or design. The chips 8 contain circuit structures 9, such as, for instance, a MOS-transistor and one or more metallization planes 10. The substrate 7 is constructed substantially similar to the first substrate 1. The circuit structures 9 are, however, different as regards their function. In addition, the second device substrate 7 is provided with via holes 11 in those positions at which electrical interconnections are subsequently to be provided with lower circuit structures. The via holes 11 are of sufficient depth to extend below the layer containing the circuit structures 9 (FIG. 2).

After completion of the device substrate 7 the passivation on the uppermost metallization plane is opened at predetermined positions. Thereafter, the individual chips of the substrate are subjected to a functional (wafer sorting) test, and any defective chips are marked, for instance by an ink drop. Following the test, a new passivation layer is deposited to close the test apertures and provide renewed protection to the otherwise exposed test sites.

An adhesion layer 12 of organic material, such as polyimide or a photoresist, is applied to the entire surface of the second substrate 7. The adhesion layer 12 which typically has a thickness of about 1–2 µm may also effect planarization of the surface. Finally, an auxiliary substrate 13, such as a silicon or quartz wafer, is adhesively connected to the adhesion layer 12. The auxiliary substrate 13 is used as a handling substrate during subsequent process steps, and provides protection to the surface of the device substrate 7 during further processing.

Thereafter, the second device substrate 7 is thinned from its back surface by etching and/or grinding down to the via holes 11, so that its thickness below the circuit structures 9 measures but a few micrometers, typically 1–2 µm. The residual thickness is also dependant, however, upon the enclosed circuit species.

Figure 4:
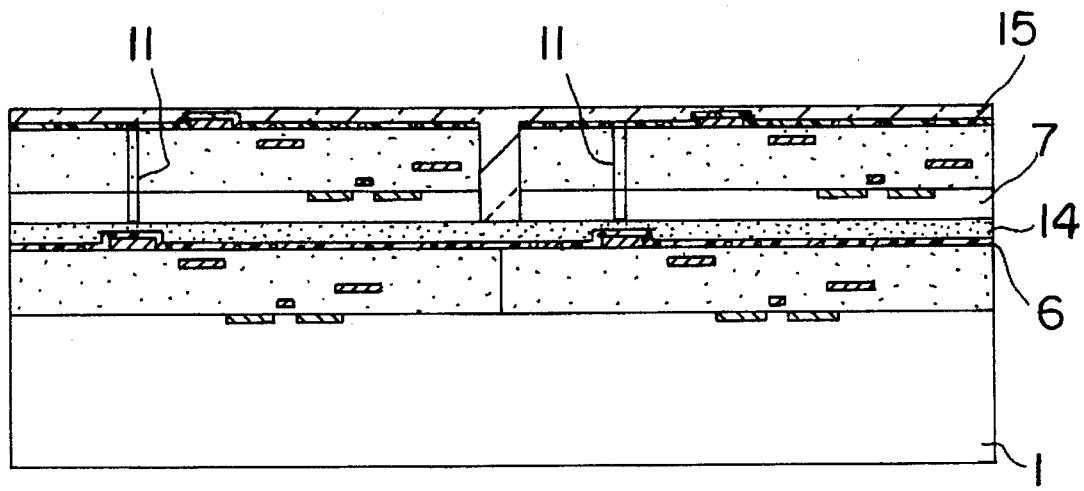
FIG. 4 depicts the substrate of FIG. 1 including a second device substrate mounted thereon in chips following planarization of its surface.

The second device substrate 7, including its handling substrate 13, is thereupon separated into individual chips. This may be done by etching, sawing or with a laser. The functioning chips, marked or unmarked, as the case may be, are then mounted and aligned on the first device substrate 1 on which there is provided an adhesion layer 14. The adhesion layer, typically having a thickness of 1–2 µm, may provide planarization of the surface. Thereafter, the handling substrate portions are removed by etching or grinding, and the exposed entire adhesion layer 12 is removed, typically by oxygen plasma or by a solvent. After the chips have been adhesively connected to it, the surface of the first substrate 1 will show moats between the individual chips which have a very low aspect ratio. These moats are filled by a planarization step during which a layer 15 is deposited to provide for a plane surface. The first device substrate 1 with the two device layers thereon may now be processed further with standard technology fabrication equipment like a conventional silicon substrate (FIG. 4).

Figure 5:
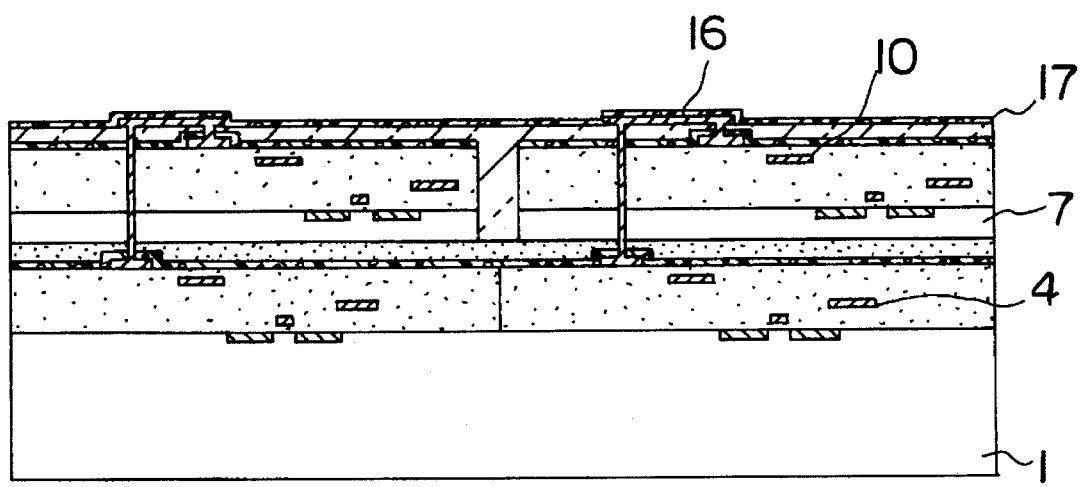
FIG. 5 depicts two vertically connected device planes.

A vertical interconnection 16 is then made between metallization planes 10 and 4 of the upper (substrate 7) and lower (substrate 1) device layers, respectively. For this purpose, a contact hole is opened by photolithography over a metallization plane 10 in the upper device layer and the prepared via holes 11 and extending to a metallization plane 4 in the lower device layer. The electrical interconnection is established by depositing and structuring of a metal. Finally, a passivation layer 17 is deposited on the surface (FIG. 5).

It will be apparent to persons skilled in the art that the electrical interconnection may also be formed in a different manner. For instance, it may be made simultaneously with the mounting of the chips on the lower substrate, by front and back leads prearranged for this purpose (vide: Introduction to the report by Y. Hayashi et al.).

It will further be appreciated by skilled artisans that in accordance with the invention two fully processed substrates (wafers), each containing circuit structures and metallization planes, are connected to each other, for instance by an adhesion layer. The adhesion layer may additionally function as a passivation layer, as well as provide for planarization of the surface. The second substrate will first have been subjected to a test, such as a wafer sort test, to select the functioning chips, i.e. chips meeting predetermined electrical specifications, of the substrate. The back surface of the substrate is then reduced in thickness and separated into individual chips. Only selected functioning chips will then be mounted and aligned in a side-by-side arrangement on the first substrate provided with an adhesion layer and thus be assembled to a new layer of chips. In this manner, a wafer is fabricated with a new chip layer or plane containing functioning chips only.

As will be appreciated, the lower substrate may already be provided with a plurality of device layers or device stacks. The chips of the upper substrate will either be subjected to a functional test during the operation, or a substrate will be provided and used which contains tested and marked chips. An auxiliary substrate is applied to the upper substrate before it is thinned and divided. Instead of thinning the upper substrate down to close to the device layers, in the case of a silicon-on-insulator (SOI) substrate the substrate below the oxide layer may be removed.

Since only individual chips are being applied to the lower substrate, the surface will not be uniformly smooth because of moats between the chips. Certain process steps, particularly photolithographic ones, can, therefore, not be executed with any high yield or results. For that reason, the surface is, therefore, preferably first planarized.

Such planarization may be provided in different ways. For instance, an insulating layer, such as spin-on glass or an oxide layer deposited by chemical vapor deposition, may first be applied to fill in the moats, and thereafter the surface may be planarized by etching, mechanical or chemomechanical grinding processes.

Following planarization, other processes, which cannot be executed at the chip level, may without any problems be executed with the substrate containing the selected chips.

Thereafter, electrical interconnections are formed between metallization planes in the upper and lower circuit planes. This may be accomplished by etching via holes previously provided during processing of the individual substrates, to increase their depth down to a metallization plane. For structuring, a photo mask is aligned with each individual chip by alignment indicia, to compensate for deviations in tolerances resulting from the mounting of individual chips and to provide a high degree of precision in the alignment.

The substrate which in its device plane now contains tested and functioning chips only, may thereafter be further processed in conventional fabrication equipment.

A further device plane may subsequently be mounted in a chip by chip manner. For this purpose, the previously made device stack and its associated substrate may serve as the new lower substrate. The number of planes or layers is not limited by the method of the invention. Moreover, not only individual planes may be stacked in a chipwise manner, but partial stacks consisting of a plurality of layers may also be mounted in this fashion.

Substrates useful in practicing the present invention include monocrystalline silicon substrates, silicon-on-insulator (SOI)—substrates, as well as substrates of different families of technology, such as semiconductors utilizing elements of groups III–V of the periodic table.

It will also be appreciated by those skilled in the art that the process steps per se herein set forth are well known and proven, so that the fabrication of three-dimensional ICs does not require developing new processes.

A particular advantage inherent in the practice of the instant invention is that only functioning chips are mounted on underlying device layers. In this manner the dependence of the overall system yield on the yield of individually processed substrates is advantageously reduced. Only individual defective chips of a device layer need be segregated, and entire device stacks are no longer unusable because of a single defective layer. Hence, by practicing the method of invention, the yield obtained in fabricating three-dimensionally integrated circuits is significantly increased and manufacturing costs are reduced as compared to prior art methods.

What is claimed is:

1. A method of making a three-dimensionally integrated circuit, comprising the steps of:
    a) providing a first substrate provided at a first surface with at least one fully processed first device layer (3) having a plurality of independent devices arranged in a side-by-side relationship therein;
    b) providing a second substrate provided at one of its surfaces with at least one fully processed second device layer having a plurality of independent devices arranged in a side-by-side relationship therein, said devices having been tested for their functionality;
    c) connecting said one surface of said second substrate to an auxiliary substrate;
    d) reducing the thickness of said second substrate from a surface opposite its said one surface;
    e) separating said auxiliary substrate and said devices in said second device layer into individual chips respectively containing functioning and defective devices;
    f) aligning and mounting chips containing functioning devices in a side-by-side arrangement on said first surface of said first substrate whereby moats are created between said mounted chips;
    g) removing said auxiliary substrate;
    h) planarizing said moats between said mounted chips;
    i) forming electrical interconnections between said devices of said mounted chips and said devices in said first device layer.

2. The method of claim 1, wherein said first and said one surface of said first and second substrates each contain one device layer.

3. The method of claim 1, wherein said devices include circuit structures.

4. The method of claim 3, wherein said first and said one surface each contain a plurality of device layers and wherein said devices and said circuit structures in said pluralities of said first and second device layers form device stacks.

5. The method of claim 1, wherein said steps of aligning and mounting said chips and of forming said electrical contacts are performed simultaneously.

6. The method of claim 4, wherein said step of providing said second substrate further comprises the step of testing said devices in said device layers of said second substrate for their functionality.

7. The method of claim 4, wherein said first substrate comprises a three dimensionally integrated circuit made by the method of claim 1 and further comprising the step of adding thereto at least one more substrate repeating steps b) through i) of claim 1.

8. The method of claim 1, wherein said auxiliary substrate is connected to said one surface by a first adhesion layer.

9. The method of claim 8, wherein said chips are mounted on said first surface by a second adhesion layer.

10. The method of claim 9, wherein said adhesion layers effect passivation of said first and said one surface.

11. The method of claim 9, wherein said adhesion layer effects a planarization of said first and said one surface.

12. The method of claim 1, wherein said electrical interconnections between said devices in said first and second substrates are formed through passage means in said first and second substrates.

13. The method of claim 12, wherein said passage means comprises via holes.

14. The method of claim 13, wherein said passage means further comprises contact apertures.

15. The method of claim 1, wherein said step of reducing the thickness of said second substrate comprising an etching process.

16. The method of claim 1, wherein said step of reducing the thickness of said second substrate comprises a grinding process.

17. The method of claim 1, wherein said second substrate comprises a silicon-on-insulator (SOI) substrate.

* * * * *